(12) United States Patent
Bohnert et al.

(10) Patent No.: US 8,441,249 B2
(45) Date of Patent: May 14, 2013

(54) HIGH VOLTAGE MEASUREMENT DEVICE USING POLED FIBERS

(75) Inventors: Klaus Bohnert, Oberrohrdorf (CH); Stephan Wildermuth, Muelligen (CH); Hubert Braendle, Oberengstringen (CH)

(73) Assignee: ABB Research Ltd, Zürich (CH)

( * ) Notice: Subject to any disclaimer, the term of this patent is extended or adjusted under 35 U.S.C. 154(b) by 236 days.

(21) Appl. No.: 12/940,684

(22) Filed: Nov. 5, 2010

(65) Prior Publication Data

US 2011/0050207 A1    Mar. 3, 2011

Related U.S. Application Data

(63) Continuation of application No. PCT/EP2008/055879, filed on May 14, 2008.

(51) Int. Cl.
*G01R 33/02* (2006.01)

(52) U.S. Cl.
USPC .......................... 324/96; 324/244.1

(58) Field of Classification Search ................. None
See application file for complete search history.

(56) References Cited

U.S. PATENT DOCUMENTS

| | | | |
|---|---|---|---|
| 5,625,737 A | 4/1997 | Saito | |
| 5,936,395 A | 8/1999 | Kevorkian et al. | |
| 6,122,415 A * | 9/2000 | Blake | 385/12 |
| 6,348,786 B1 | 2/2002 | Bjarme et al. | |
| 7,911,196 B2 * | 3/2011 | Bohnert | 324/96 |
| 2002/0006244 A1 | 1/2002 | Bohnert | |
| 2006/0153509 A1 | 7/2006 | Bohnert et al. | |

FOREIGN PATENT DOCUMENTS

| | | |
|---|---|---|
| EP | 1 154 278 A2 | 11/2001 |
| EP | 1 418 452 A1 | 5/2004 |
| JP | 62-178909 A | 8/1987 |
| WO | WO 90/08970 A1 | 8/1990 |
| WO | WO 97/01100 A1 | 1/1997 |
| WO | WO 00/19217 A1 | 4/2000 |
| WO | WO 03/023320 A1 | 3/2003 |
| WO | WO 2008/077256 A1 | 7/2008 |

OTHER PUBLICATIONS

*International Search Report (PCT/ISA/210) issued on Mar. 19, 2009, by European Patent Office as the International Searching Authority for International Application No. PCT/EP2008/055879.
*Written Opinion (PCT/ISA/237) issued on Mar. 19, 2009, by European Patent Office as the International Searching Authority for International Application No. PCT/EP2008/055879.
*Bohnert et al., "Temperature and Vibration Insensitive Fiber-Optic Current Sensor", Journal of Lightwave Technology, Feb. 2002, pp. 267-276, vol. 20, No. 2.

* cited by examiner

*Primary Examiner* — Vinh Nguyen (74) *Attorney, Agent, or Firm* — Buchanan Ingersoll & Rooney PC (57) ABSTRACT

Two transversely poled fibers are disclosed which can be wound around a holder with their poling directions being anti-parallel. A coupling exchanges the polarization directions of the modes of the fibers. Thermally and mechanically caused birefringence changes can thereby be substantially cancelled, while electrical field induced birefringence changes can be added, to provide a more robust high voltage measuring device.

24 Claims, 7 Drawing Sheets

HIGH VOLTAGE MEASUREMENT DEVICE USING POLED FIBERS

RELATED APPLICATION

This application claims priority as a continuation application under 35 U.S.C. §120 to PCT/EP2008/055879 filed as an International Application on May 14, 2008 designating the U.S., the entire content of which is hereby incorporated by reference in its entirety.

FIELD

The disclosure relates to a high voltage measurement device based on poled waveguides.

BACKGROUND INFORMATION

WO90/08970 describes a procedure for poling an optical glass fiber by applying a transverse, high electric field at elevated temperatures. The poling imparts permanent second order nonlinearity to the fiber. A transverse electric field applied to the poled fiber induces refractive index changes proportional to the field strength (Pockels effect). In contrast, unpoled fibers (having macroscopic inversion symmetry) exhibit the Kerr effect (i.e. the index change is very small and varies in proportion to the square of the field strength). WO90/08970 and WO 97/01100 describe voltage sensors using a poled fiber. The fiber describes helical or spiral-like paths running from ground to high voltage potential. The light waves in the fiber experience an optical phase shift which is a measure for the voltage. The phase shift is measured in a Mach-Zehnder interferometer or by polarimetric means.

However, this type of sensor can be sensitive to various external parameters, such as temperature, mechanical shock and vibration, which can lead to an optical phase change and can therefore seriously deteriorate the voltage measurement.

WO 03/023320 discloses an electro-optic voltage sensor having a poled optical fiber in which the poling direction is reversed and a 90°-splice swaps the polarization modes at mid-length. Two orthogonal polarization modes are injected by using a Faraday rotator with 90° rotation angle per pass.

SUMMARY

A voltage measurement device is disclosed comprising: a holder for arrangement between two potentials; a first waveguide transversally poled in a first poling direction; a second waveguide transversally poled in a second poling direction, wherein said first and second waveguides are of identical type and are arranged parallel to one other for each carrying at least one optical mode having two orthogonal light polarization directions, and wherein said first and second waveguides are supported on said holder with said first and said second poling directions being anti-parallel; a coupling between said first and said second waveguides for exchanging said orthogonal light polarization directions of the optical modes in the first and in the second waveguides such that a photon running along one of the first and second waveguides and being polarized along a slow axis of the one waveguide is coupled to a photon being polarized along a fast axis of the other of the first and second waveguides and vice versa; a control unit for sending light at least once through said first waveguide, said coupling and said second waveguide for measuring a phase delay between: light waves that travel through said first waveguide with a polarization along the first poling direction and through said second waveguide with a polarization perpendicular to said second poling direction, and light waves that travel through said first waveguide with a polarization perpendicular to said first poling direction and through the second waveguide with a polarization along said second poling direction; and a Faraday rotator with a rotation angle per pass of 45°+k*90°, with k being any integer number, arranged between the control unit and the first waveguide.

A voltage measurement device is disclosed comprising: a holder for arrangement between two potentials; a first waveguide transversally poled in a first poling direction; a second waveguide transversally poled in a second direction, wherein said first and second waveguides are of identical type and are arranged parallel to one other for each carrying at least one optical mode having two orthogonal light polarization directions, and wherein said first and second waveguides are supported on said holder with said first and said second poling directions being anti-parallel; a coupling between said first and said second waveguides for exchanging said orthogonal light polarization directions of said optical modes; a control unit for sending light at least once through said first waveguide, said coupling and said second waveguide for measuring a phase delay between: light waves that travel through said first waveguide with a polarization along the first poling direction and through said second waveguide with a polarization perpendicular to said second poling direction, and light waves that travel through said first waveguide with a polarization perpendicular to said first poling direction and through the second waveguide with a polarization along said second poling direction; a pair of identical polarization maintaining fibers located after the first and second waveguides, as part of a detection system, joined with a 90° splice; and a phase controller for controlling a length of one of the polarization maintaining fibers to maintain a differential phase of interfering waves at quadrature.

BRIEF DESCRIPTION OF THE DRAWINGS

Further embodiments, advantages and applications of the disclosure are set forth in the following description, which makes reference to the figures wherein.

DETAILED DESCRIPTION

Exemplary embodiments of a measurement device as disclosed herein can reduce the influence of external parameters on the measured signal.

For example, a first waveguide poled in a first poling direction and a second waveguide poled in a second poling direction are provided. Both exemplary waveguides can be essentially identical type (e.g., they can be of the same materials and have the same waveguiding properties) and can be arranged parallel to each other. Each waveguide is dimensioned to carry at least one spatial mode having two orthogonal light polarizations. In the following the orthogonally polarized waves are referred to as orthogonal (polarization) modes. Both waveguides are commonly supported on a holder with the first and second poling directions being anti-parallel to each other. The two waveguides are optically coupled to each other (e.g., directly or through an intermediary fiber), in such a manner that the coupling exchanges the light polarization directions of the orthogonal modes in the first and in the second fiber.

According to exemplary embodiments, electro-optically induced phase delays between the two polarization directions in the first and second waveguides are added, while strain- or temperature induced phase delays compensate each other, which allows a more accurate voltage measurement that can be less dependent on the types of external parameters or perturbations mentioned herein.

A coupling between the waveguides that "exchanges the polarization direction of the modes" of the waveguides is to be understood as a coupling that converts a photon running along one waveguide and being polarized along the "slow axis" of the waveguide to a photon being polarized along the "fast axis" of the other waveguide, and vice versa. In an exemplary simple embodiment, such a coupling can, for example, be achieved by direct orthogonal splicing of the two waveguides. Alternatively, a coupling fiber may be provided between the two waveguides; the coupling fiber can be formed by a polarization maintaining fiber that is spliced to the first waveguide in a first orientation and to the second waveguide in a second orientation, with the first and second orientations being rotated by 90°.

A "transversally poled" optical waveguide is a waveguide that has been poled and therefore has a non-centric structure in a poling direction transversally (i.e., transversely), for example perpendicular to its longitudinal axis.

The current disclosure can, for example, be especially suited for measuring high voltages above 10 kV.

EMBODIMENTS OF THE DISCLOSURE

Measurement Principle

Figure 1:
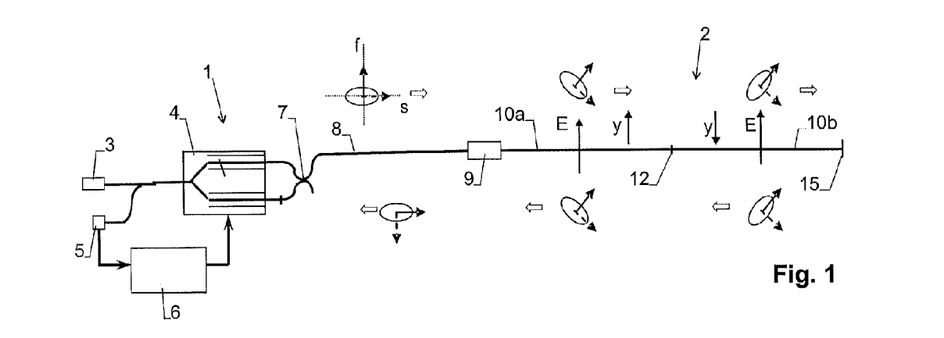
FIG. 1 shows a first exemplary embodiment of an electro-optic voltage sensor.

FIG. 1 shows an exemplary fiber-optic voltage sensor having a control unit 1 and two fibers 10a, 10b. Fibers 10a, 10b form polarization maintaining waveguides. They are transversally poled fibers that exhibit, under the application of a transversal electrical field, a linear field-induced birefringence change.

Control unit 1 includes a light source 3, a phase modulator 4 for a nonreciprocal phase modulation, a light detector 5, a signal processor 6, and a polarization maintaining fiber coupler 7. Control unit 1 and the fibers 10a, 10b form a polarization-rotated reflection interferometer and use an interrogation technique as known from fiber gyroscopes, for details see Ref. [1, 2].

Two orthogonal linearly polarized light waves (indicated by solid and dashed arrows) exit from control unit 1 and travel through a polarization maintaining (pm) feed fiber 8 (e.g. an elliptical-core fiber) to a Faraday rotator 9 with a rotation angle of 45° per pass (or, equivalently, a rotation angle of 45°+k·90° with k being any integer number). In other words, each light wave is rotated by 45° each time it passes through Faraday rotator 9. The rotation is non-reciprocal (i.e., the rotation as seen from an observer looking towards the light beam is, for example, clockwise if the beam propagates from left to right), but counterclockwise if the beam propagates from right to left. The total rotation is thus 90° (or 90°+k·180° with k being an integer number). The light waves exiting from Faraday rotator 9 are coupled into a first transversally poled pm sensing fiber 10a. The fast and slow axes of this sensing fiber are oriented at 45° with regard to the axes of the pm feed fiber 8 left of the rotator 9. As a result the polarization directions after the rotation again coincide with the birefringent fiber axes.

A second identical transversally poled pm sensing fiber 10b is spliced at a splice 12 with its axes rotated by 90° with respect to first sensing fiber 10a. The waves polarized parallel to the slow axis in first fiber 10a are then polarized along the fast axis in second fiber 10b and vice versa. The waves are reflected at the end of second fiber 10b by a mirror 15 and then retrace their paths. Nonreciprocal Faraday rotator 9 introduces another 45° rotation that adds to the first rotation. The total rotation on the way forward and backward is thus 90° (i.e., the light waves again return with swapped polarizations to control unit 1, as in the current sensor of EP 1 154 278, the disclosure of which is incorporated herein by reference in its entirety. This can be advantageous because it can keep the total roundtrip path imbalance of the waves at or near zero and thus within the coherence length of the low coherent light source 3. Furthermore temperature and vibration induced optical phase changes in the fiber between modulator 4 and Faraday rotator 9 largely cancel each other.

The two sensing fibers 10a, 10b to the right of Faraday rotator 9 act as field sensors and are used to measure the periodic field induced extra birefringence caused by an alternating electric field E having a transversal component to the longitudinal axis of the fibers. The induced birefringence causes a corresponding differential phase shift between the two orthogonal waves.

The poling directions y of the two fibers (i.e., their polar axes) can be anti-parallel as shown in FIG. 1.

The combination of the anti-parallel poling directions and the swapping of the polarization directions due to the 90°-splice between the fibers results in field-induced phase shifts in the sensing fibers of the same magnitude and sign, if the electric field distributions E(z) along the two fibers are the same. In a voltage sensor, equal field distributions are achieved by aligning the two fibers as illustrated in FIG. 10-13 shown below.

Exemplary advantages of using a first and a second sensing fiber 10a, 10b joint by a 90°-splice and with an alignment as in FIG. 10-13 are the following:

The second pm sensing fiber 10b balances the optical path imbalance between the two orthogonal waves introduced in first sensing fiber 10a. As mentioned, this can be desirable as it keeps the total path imbalance within the coherence length of a low coherent light source.

As both fibers experience the same temperature and mechanically induced phase shifts (e.g. due to shock and vibration) the corresponding optical phase shifts in the two fibers cancel each other. Thus, the sensor can be significantly more robust with regard to external perturbations than sensors according to the state of the art. Furthermore, the signal processing becomes simpler, if large quasi-static phase excursions (e.g. due to temperature changes) are avoided. The total phase changes should, in exemplary embodiments, remain within an interval of $\pm\pi$.

Second fiber 10b doubles the sensitivity of the voltage sensor.

It should be noted that with an interrogation technique based on nonreciprocal phase modulation the apparent sensitivity of the two poled fibers 10a, 10b to an applied alternating voltage varies as a function of the time delay between the forward and backward propagating waves and thus as a function of the length of the fibers and the location along the fiber. The voltage-induced roundtrip optical phase shift is at its maximum, if the time delay is negligible compared to the period of the alternating voltage and becomes zero, if the delay corresponds to half a period. Furthermore, the effective sensitivities of two sections will differ, if the delay is not negligible. However, for a voltage of a frequency of 50 or 60 Hz and fiber lengths of some meters the time delay is negligible and the delay effects can be disregarded.

Figure 2:
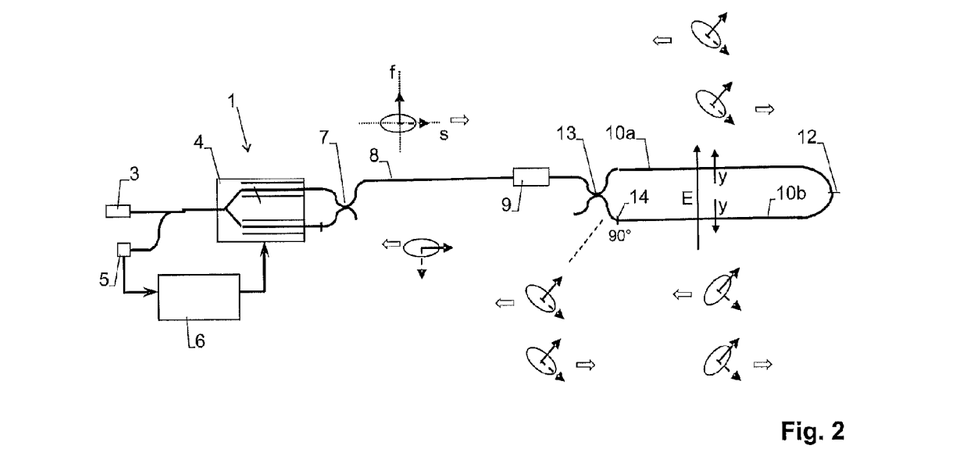
FIG. 2 shows a second exemplary embodiment of an electro-optic voltage sensor.

FIG. 2 shows a modification of the set-up in FIG. 1. A pm fiber coupler 13 and the two transversally poled pm sensing fibers 10a, 10b form a loop mirror. The coupler end at Faraday rotator 9 is oriented like first sensing fiber 10a section in FIG. 1. The loop contains two 90°-splices 12, 14. The splices divide the loop in two halves with identical lengths. An extra reflector is not needed. Two pairs of orthogonal polarizations with orientations as indicated counter-propagate in the loop. The functions of the two loop halves are the same as the ones of the two sensing fibers 10a, 10b in FIG. 1. The phase shifts in the fibers 10a, 10b add, if the poling directions y and the field directions E are as indicated in FIG. 2. A potential advantage of this configuration is that the effective sensitivities of fibers 10a, 10b can always be the same independent of the time delay.

The phase modulator 4 in FIGS. 1 and 2 is, for example, an integrated-optics lithium modulator, see e.g. Ref. [1]. The modulator also acts as a polarizer. Another alternative is a piezoelectric modulator as illustrated in Ref. [2].

Figure 3:
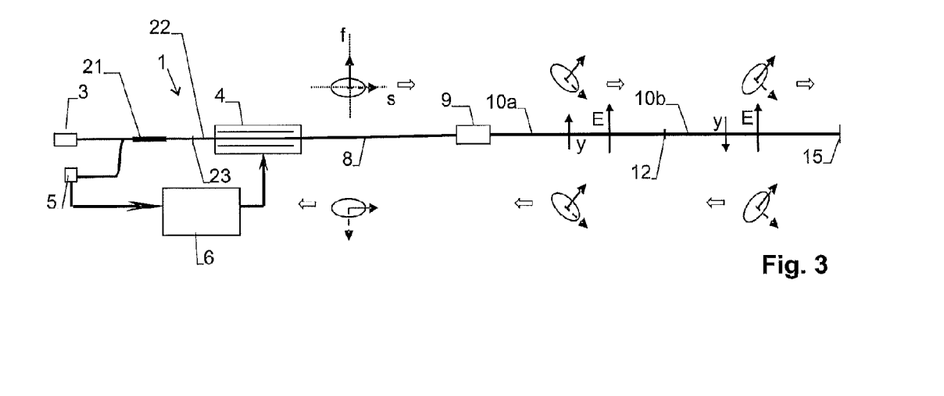
FIG. 3 shows a third exemplary embodiment of an electro-optic voltage sensor.

FIG. 3 shows the same configuration as FIG. 1 but with a different type of integrated-optics phase modulator 4. The modulator is a birefringence modulator which directly modulates the phase of orthogonal light waves. The pm coupler 7 of FIGS. 1 and 2 is then no longer needed. The depolarized light from light source 3 (depolarizer not shown) is polarized in a fiber polarizer 21 and subsequently coupled into an entrance pm fiber lead 22 of the modulator at splice 23. The polarization direction is at 45° to the axes of the pm fiber lead (45° splice). As a result two orthogonal waves of equal amplitude are excited. The fast and slow axes of both pm fiber leads 22, 8 of modulator 4 are parallel to the electro-optic axes of the modulator.

Figure 4:
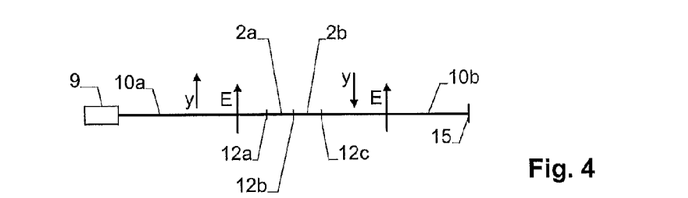
FIG. 4 shows part of a fourth exemplary embodiment of an electro-optic voltage sensor.

FIG. 4 shows a modification of the sensor. (The sensor parts left of the rotator 9 are the same as in any of the previous Figures and for simplicity are not shown in FIGS. 4 and 5). Here, there are two unpoled pm fiber sections 2a, 2b put between the sensing fiber 10a, 10b, with the splice 12a to first sensing fiber 10a being a 0° splice, the splice 12b between the unpoled pm fiber sections 2a, 2b being a 90° splice and the splice 12c to second sensing fiber 10b being a 0° splice. Alternatively, the splices between 10a/12a and 12b/10b may both be 90°-splices. The unpoled sections 2a, 2b are, for example, of circular cross-section and facilitate the connection of, for example, two poled fibers with D-shape. Direct splicing of two D-shaped fibers (as described above) with a 90°-offset in the core orientation can be more difficult. The two unpoled sections 2a, 2b are, for example, identical in type and length and joined with a 90°-splice in order to keep the total path imbalance of the orthogonal modes at zero.

Figure 5:
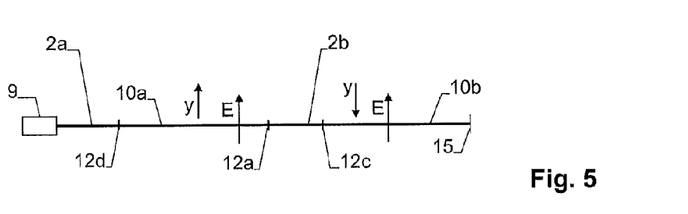
FIG. 5 shows part of a fifth exemplary embodiment of an electro-optic voltage sensor.

Alternatively, and as shown in FIG. 5, one of the unpoled fiber sections 2a, 2b may be between Faraday rotator 9 and first poled sensing fiber 10a, connected to first sensing fiber 10a by means of splice 12d. The splices are again oriented in such a way that the path imbalances in 12a/12b cancel each other. Alternatively one of the unpoled fiber sections 2a, 2b can be arranged between second poled sensing fiber 10b and reflector 15.

In the exemplary embodiments shown so far, we have:
- a control unit 1 for sending light at least once through the first fiber 10a, a coupling (either formed by splice 12 or by unpoled fibers 2a, 2b and their splices) and through the second fiber 10b;
- a control unit 1 adapted to measure a phase delay suffered between
  - light waves that travel through first fiber 10a with a polarization along the poling direction y of the first fiber and through the second fiber 10b with a polarization perpendicular to the poling direction of the second fiber and
  - light waves that travel through the first fiber 10a with a polarization perpendicular to the poling direction y of the first fiber and through the second fiber 10b with a polarization along the poling direction 10b of the second fiber.

Figure 18:
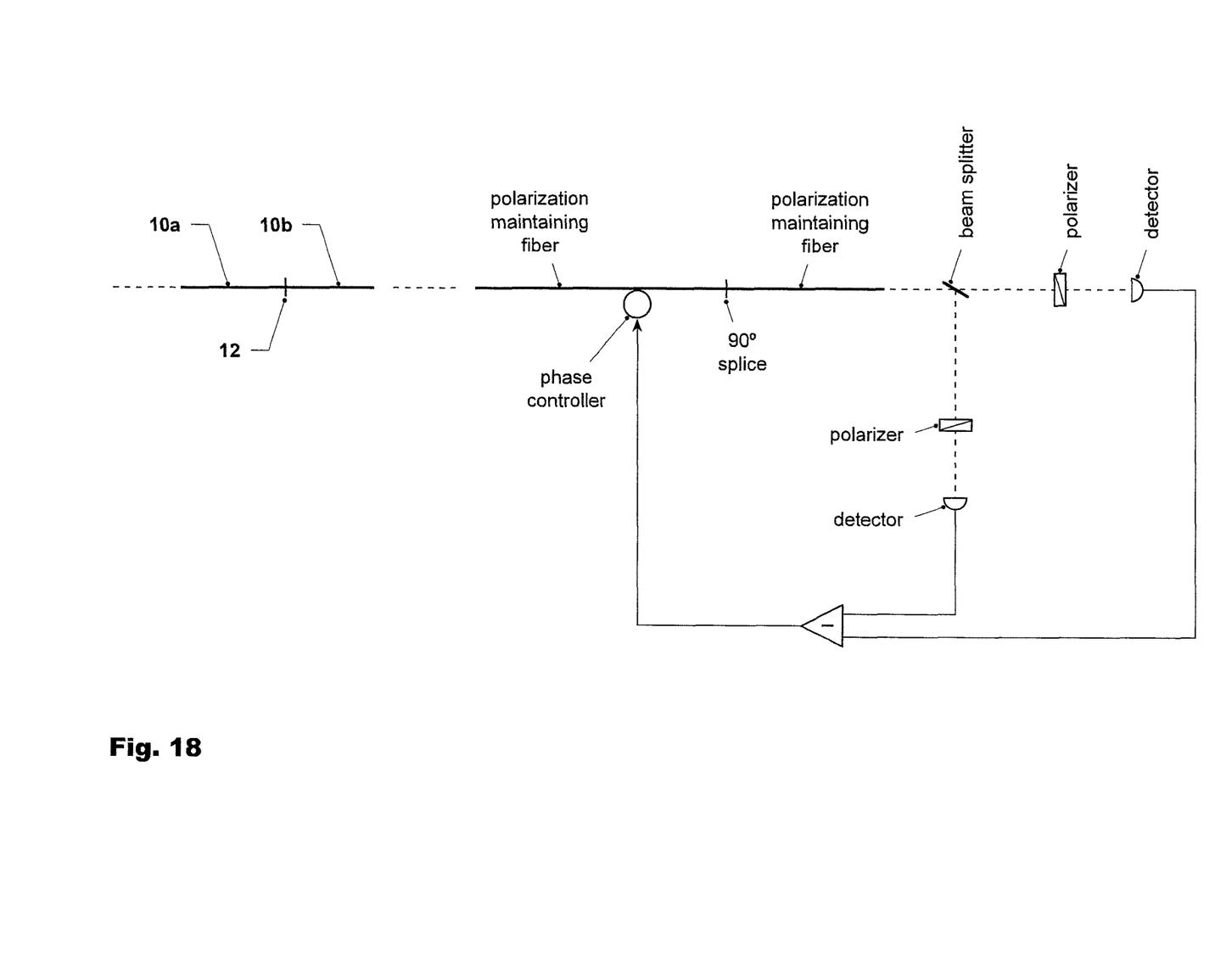
FIG. 18 shows an exemplary embodiment of components of an electro-optic voltage sensor in which two orthogonal light waves, after having passed first and second fibers, are sent through another pair of identical polarization maintaining fibers, and a phase controller controls a length of one of the polarization maintaining fibers to maintain a differential phase of interfering waves.

The above described exemplary scheme of reciprocal phase modulation using a Faraday rotator can particularly advantageous, but the measurement can also be carried out by means of a known polarimetric set-up. For example, as illustrated in FIG. 18, the two orthogonal light waves, after having passed fibers 10a, 10b, are sent through another pair of identical polarization maintaining fibers that are part of the detection system and are again joined with a 90° splice. Subsequently, the waves are brought to interference at two polarizers oriented at +/−45° with respect to the fiber axes. The resulting interference signals are of opposite phase. The difference of the two signals is fed to a phase controller which maintains the differential phase of the interfering waves at quadrature. Quadrature may be adjusted by means of a piezoelectric modulator which controls the length of one of the pm fibers, see Ref [5]. Fibers 10a, 10b may be operated in transmission or in reflection in this context.

Poled Fibers:

The sensing fibers 10a, 10b of the above devices are transversally poled (or need to have at least a transverse poling direction component) in order to exhibit a linear electro-optic effect.

The thermal poling of glass fibers has been described, for example, in WO90/08970 as well as in Ref [3] and [4]. Fiber poling is achieved by applying to the fiber core region a high transverse electric field at elevated temperatures, (e.g. at 300°

C.). The field causes a rearrangement of electric charges. As a result, a permanent electric field 28 (see FIG. 6) remains frozen within the fiber after the fiber has been cooled down to room temperature under the applied poling field. The poling-induced anisotropy leads to an electro-optic effect which varies linearly with an applied electric field.

Figure 6:
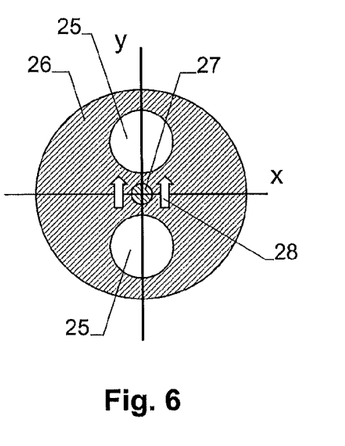
FIG. 6 shows a cross section of an exemplary fiber with circular cladding.

The poling electric field can be generated by applying a voltage of a few kilovolt to electrode wires in two holes 25 in the fiber cladding 26, see FIG. 6. The holes 25 run on opposite sides along the fiber core 27, which forms the fiber's waveguide. For voltage sensing it can be desirable to use a birefringent fiber (e.g., a polarization-maintaining fiber, pm fiber), such as an elliptical core fiber, which supports two modes with orthogonal polarization directions (parallel to the slow and fast birefringent fiber axes x and y). In an elliptical-core fiber these are the major and minor core axes. The poling direction is chosen parallel to a birefringent axis (y-direction in FIG. 6).

Once the fiber is poled, an electric field of strength E along y induces an electro-optic index difference for the two orthogonally polarized light waves:

$$\Delta n_{eo} = rE \quad (1),$$

where r is an effective electro-optic coefficient, for example, on the order of 1 pm/V. The resulting differential electro-optic phase shift of the two waves of wavelength λ in a fiber of length l is then:

$$\Delta \phi_{eo} = (2\pi/\lambda) \cdot \Delta n_{eo} \cdot l \quad (2).$$

Fields along x or z (z=fiber direction) do not produce any differential phase shift. The field strength E is the effective field strength at the fiber core, which at a given external field strength E' depends on the dielectric constant and the shape of cross-section of the fiber.

For voltage measurement the fiber (with the wires for poling removed) is, for example, placed on a helical path of constant pitch angle between the two electric potentials, for example ground and high-voltage. The fiber axes are aligned such that at any point along the fiber the poling direction is approximately parallel to the longitudinal axis of the helix, see WO90/08970 and WO 97/01100. It can be shown that the total induced phase shift $\Delta \phi_{eo}$ then corresponds in good approximation to the path integral ∫E·ds along the longitudinal axis of the helix and thus to the voltage to be measured.

Figure 7:
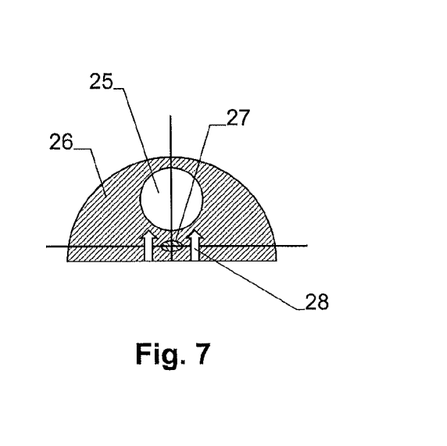
FIG. 7 shows a cross section of an exemplary fiber with a D-shaped cladding.
Figure 8:
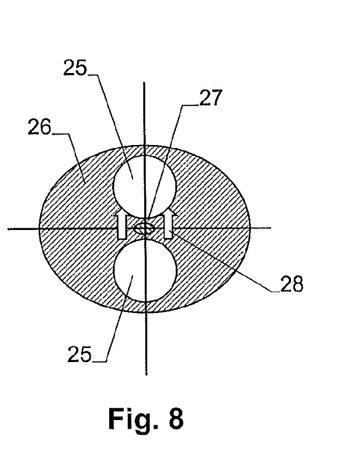
FIG. 8 shows a cross section of an exemplary fiber with an elliptical cladding.
Figure 9:
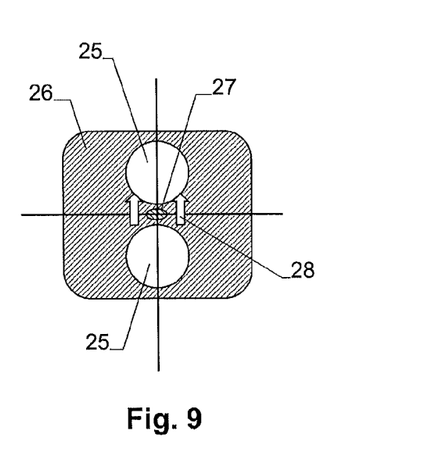
FIG. 9 shows a cross section of an exemplary fiber with rectangular cladding.

In order to facilitate the fiber alignment (alignment of the poling direction) it can be desirable to employ fibers with non-circular fiber cross-section. Examples are shown in FIGS. 7, 8 and 9. FIG. 7 shows a fiber with a cladding having D-shape, FIG. 8 a fiber with a cladding having elliptical shape, and FIG. 9 a fiber with a cladding having rectangular or square shape.

Figure 10:
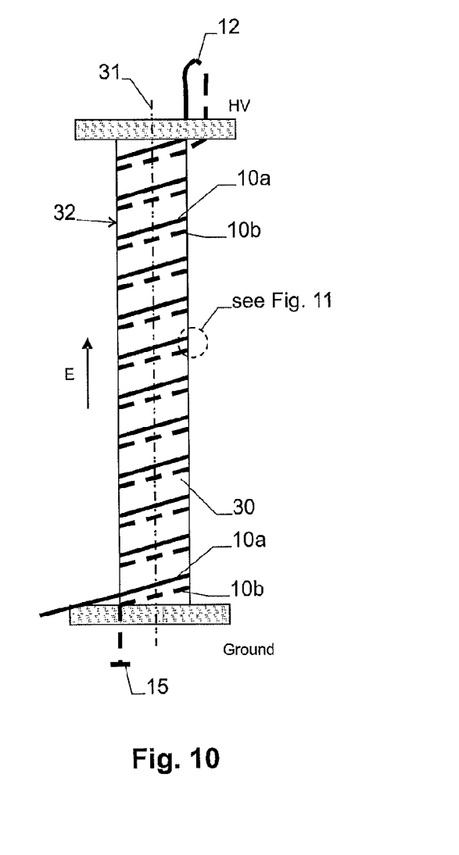
FIG. 10 shows a first exemplary embodiment of a sensor device.
Figure 11:
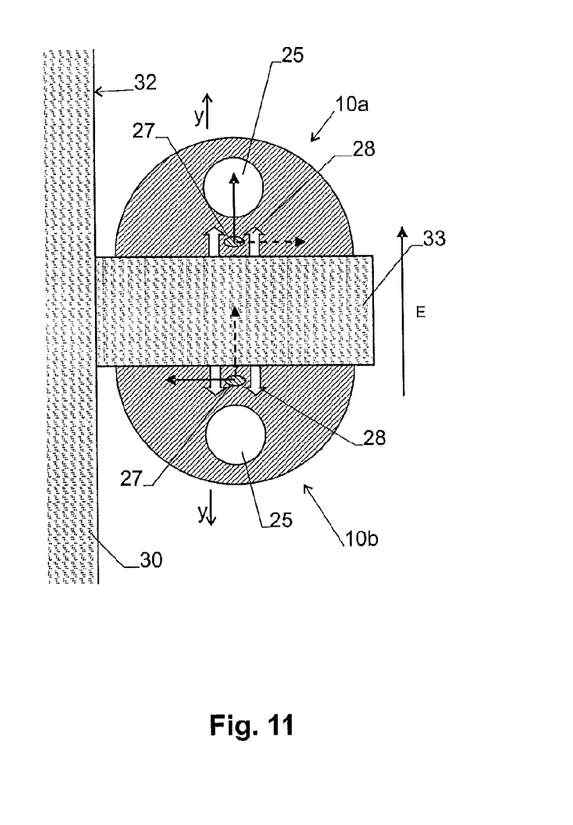
FIG. 11 shows a sectional view of a detail of FIG. 10.

Voltage Sensor Set-Up and Packaging:

FIGS. 10 and 11 show an exemplary embodiment of the high voltage measurement device. It includes a holder 30, which can, for example, be a rod with a longitudinal axis 31. Holder 30 is arranged between ground and the high voltage to be measured, with longitudinal axis 31 extending substantially along the electrical field.

Holder 30 has an outer cylindrical surface 32. First fiber 10a and second fiber 10b are helically wound around surface 32 (e.g., they run in a bifilar manner along a helical path whose center is at the location of longitudinal axis 31). The helical path can have constant pitch angle. The poling directions y of the two fibers are not orthogonal (but essentially constant) with respect to the longitudinal axis 31 such that an electric field along said axis generates a linear electro-optic effect in the fiber's waveguide. For example, the poling directions are essentially parallel to axis 31.

First fiber 10a and second fiber 10b extend parallel to each other, preferably at a mutual distance smaller than the pitch of their helical paths. Each fiber 10a, 10b extends over the whole length of holder 30 between high voltage and ground.

FIG. 11 shows an exemplary embodiment in which orientations of fiber axes and the poling directions y are shown which are needed to achieve the objectives of cancelling thermal and mechanical phase shifts and doubling the electro-optic phase shifts. The directions of the two polarization modes with respect to the core axes are swapped in the two fiber sections as a result of the intermediate 90°-splice 12.

The two sensing fibers 10a, 10b with waveguides or cores 27 are commonly supported on holder 30. In the embodiment of FIGS. 10 and 11, the two sensing fibers 10a, 10b are for example, mounted on opposite sides of a common carrier 33 such that they experience the same temperature changes and mechanical perturbations. Due to the mode swapping between the fibers 10a, 10b the resulting differential optical phase shifts are equal in magnitude, but opposite in sign and therefore cancel each other. Furthermore, the sensing fibers 10a, 10b are mounted with opposite directions of the frozen-in electric field. This measure, in combination with the polarization swapping, doubles the electro-optic phase shift.

Carrier 33 has, in the embodiment of FIG. 11, the form or a ledge protruding from surface 32 and extending helically around holder 30.

Figure 12:
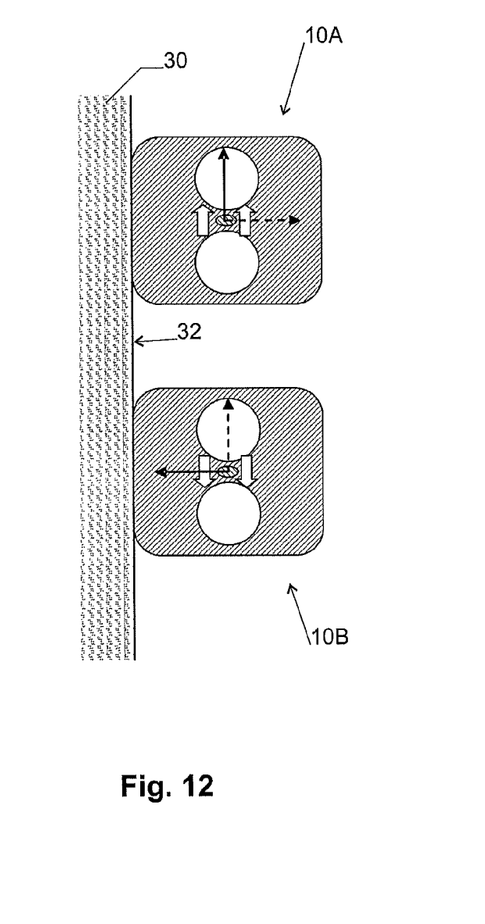
FIG. 12 shows a second exemplary embodiment of a sensor device.

In FIG. 11 two sensing fibers 10a, 10b of D-shape are mounted on the top and bottom surfaces of carrier 33 in order to achieve the proper fiber alignment. Alternatively, fibers with elliptical, square or rectangular cross-sections may be used, such as shown in FIGS. 6-8, which may be wrapped directly to the surface 32 of holder 30, as shown in FIG. 12.

Figure 13:
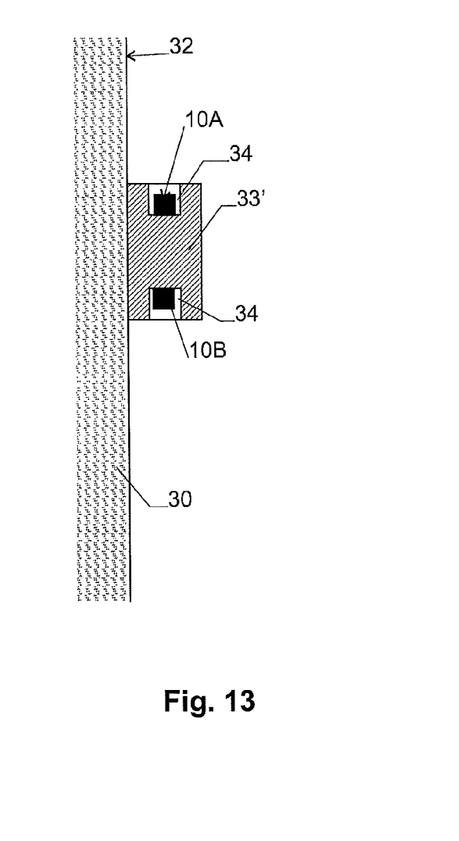
FIG. 13 shows a third exemplary embodiment of a sensor device.

A further alternative is shown in FIG. 13. Here, the two fibers are pre-mounted in grooves 34 of a flexible support strip 33' acting as a carrier. Subsequently, the strip 33' is wrapped on the holder 30. This procedure may facilitate the sensor preparation. Furthermore, the fibers are mechanically protected within the grooves 34 during the further packaging of the device (see below). If needed, the grooves 34 may be covered by appropriate lids (not shown).

Figure 14:
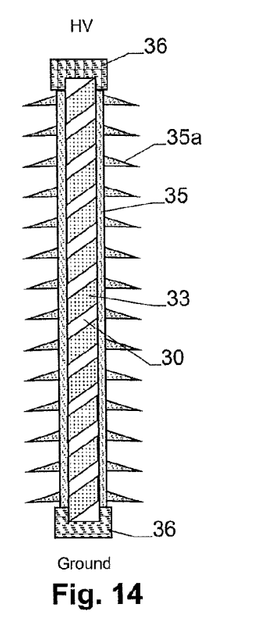
FIG. 14 shows a partial sectional view of an exemplary device in its insulation housing.
Figure 15:
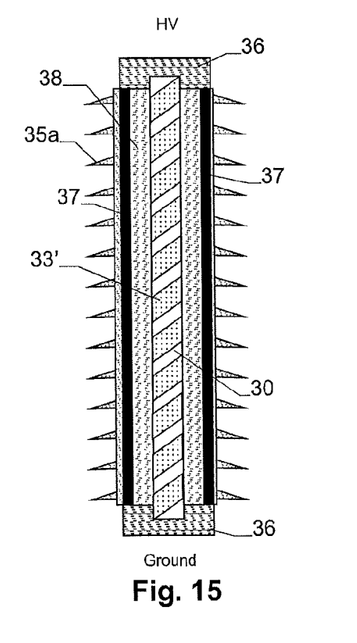
FIG. 15 shows a second exemplary embodiment of a device in its insulation housing.

FIGS. 14 and 15 show two options for high-voltage proof packaging of the sensor for outdoor applications. In FIG. 14, holder 30 according to FIGS. 10-13 is arranged in an insulation housing 35 of silicon that carries a plurality of circumferential sheds 35a. The sheds 35a provide a sufficiently large electric creep distance. The silicone is applied to holder 30 in a mould process, with the fibers 10a, 10b being arranged between holder 30 and insulation housing 35.

Both ends of the device are equipped with metal flanges 36. A similar packaging technique is used for example in the manufacturing of surge arresters. A number of composite rods may be included in the structure to increase its mechanical strength.

In FIG. 15, holder 30 is mounted in a composite insulator tube 37 of fibre-reinforced resin. For electric insulation, the gap between insulator tube 37 and holder 30 is, for example filled with a solid insulation material 38. An example is polyurethane foam with sufficient compressibility to avoid excessive stresses due to thermal expansion. Other options are dielectric liquids (e.g. transformer oil, silicone oil) or insulating gases (e.g. $SF_6$, nitrogen, air).

Figure 16:
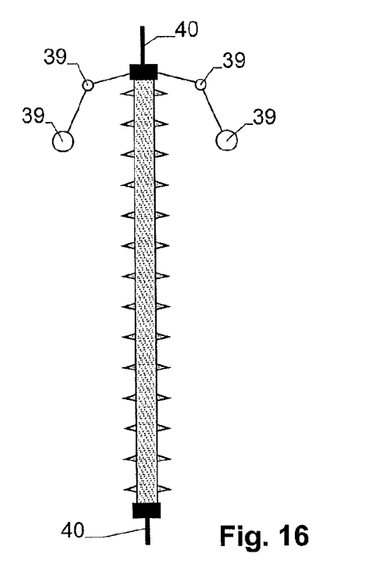
FIG. 16 shows an exemplary device with corona rings.

The sensor can be equipped with one or several corona rings 39, as shown in FIG. 16, which can provide a more homogeneous distribution of the electric field. FIG. 16 also shows two suspension cables 40 for mounting the device.

Figure 17:
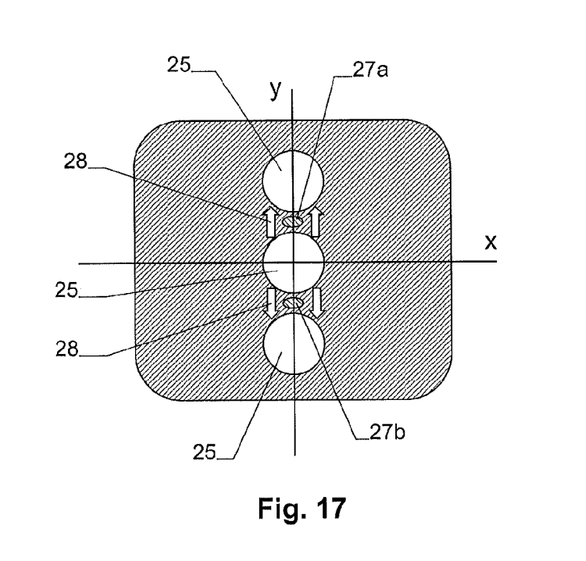
FIG. 17 shows a cross section of an exemplary fiber with two cores.

Further Exemplary Sensor Modifications:

FIG. 17 shows the cross section of a poled fiber with two cores 27a, 27b. In this geometry two frozen-in electric fields 28 with opposite directions as indicated are created in the core regions during poling. In this way the two-fiber arrangement depicted in FIG. 11 can be replaced by a single fiber body allowing for even better temperature and vibration compensation. Furthermore, sensor manufacturing can become simpler.

In general, the present disclosure is applicable to a device having a first and a second elongate waveguide, which can be formed by a single fiber having two cores or by two fibers having single cores. The waveguides can, for example, be single-mode waveguides.

When using single-core fibers as shown in FIGS. 6-9 and 11, the waveguides correspond to the cores 27 of two fibers. The fibers can be mounted to a common holder 30, and to opposite sides of a common carrier 33, 33', such as shown in FIGS. 11 and 13. The two fibers can, however, also be arranged adjacent to each other, and, for example, they can be directly welded or glued to each other. In any case, the two fibers can, for example, be of identical design, such that all effects except for electrical-field induced refractive index changes cancel each other.

Alternatively, the two waveguides can be formed by two cores 28a, 28b of a single fiber, such as shown in FIG. 17.

Instead of using a series two pairs of poled fibers as in FIG. 14, several pairs of poled fiber may be arranged in series (e.g., a plurality of pairs of the first waveguides and the second waveguides are arranged in series). Each subsequent poled fiber pair is again arranged on its own cylindrical support body like the first pair. Thus, the voltage sensor may include (e.g., consist of) a series of individual modules which in certain applications may give enhanced design flexibility.

Each of the two waveguides or sensing fibers 10a, 10b may be composed of several individual poled fiber segments joint by 0°-splices (optionally with one or two short pm-fiber sections in between the segments, as described above, if they are needed to facilitate the splicing). This approach may be chosen if the maximum fiber length that can be poled is limited (e.g., due to the maximum length of electrode wires or liquid electrode material which can be inserted in the fiber holes).

Instead of an integrated phase modulator, a piezoelectric modulator may be used (see e.g. Ref. [3]). Piezoelectric modulators can be used in combination with open-loop detection.

Alternatively to the detection with nonreciprocal phase modulation and a Faraday rotator, a polarimetric detection scheme as described, for example, in Ref. [3] or in U.S. Pat. No. 5,936,395 may be employed. Operation of the poled fiber sections in transmission or reflection is possible.

A single light source may be used for several sensors (e.g., for a combination of three sensors in a three-phase high voltage apparatus). The depolarized light is then split by several fiber couplers onto the three sensor channels, for example by a 1:3-coupler followed by a parallel arrangement of three 2:1 couplers. The photodiodes are then at the free exits of the 2:1 couplers. All examples and figures are given for exemplary purpose only and shall neither de-limit the claims nor the independent use of features of the disclosure.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCES

The following are cited in the foregoing disclosure, and are hereby incorporated by reference herein in their entireties:
1. "The fiber-optic gyroscope", Nerve Lefevre, Artech House, Boston, London, 1993.
2. EP 1 154 278
3. P. G. Kazansky et al., "Glass fiber poling and applications", J. Lightw. Technology 15, 1484, 1997.
4. M. Janos et al., "Growth and decay of the electro-optic effect in thermally poled B/Ge codoped fiber", J. Lightw. Technology 17, 1037, 1999.
5. D. A. Jackson, R. Priest, A. Dandridge, and A. B. Tveten, "Elimination of drift in a single-mode optical fiber interferometer using a piezoelectrically stretched coiled fiber", Appl. Opt., vol. 19, pp. 2926-2929, 1980.

LIST OF REFERENCE NUMBERS

1: control unit
3: light source
2a, 2b: unpoled pm fiber sections
4: phase modulator
5: light detector
6: signal processor
7: pm fiber coupler
8: feed fiber
9: Faraday rotator
10a, 10b: sensing fibers
12a, 12b, 12c: splices
13: pm fiber coupler
12, 14: 90° splices
15: mirror
21: fiber polarizer
22: pm fiber lead
23: splice
25: holes
26: cladding
27, 27a, 27b: core
28: in-frozen field
30: holder
31: longitudinal axis of the holder
32: holder surface
33: carrier
33': flexible support strip
34: grooves
35: insulation housing
35a: sheds
36: metal flanges
37: composite insulator tube
38: solid insulation material
39: corona rings
40: suspension cables

What is claimed is:
1. A voltage measurement device comprising:
a holder for arrangement between two potentials;
a first waveguide transversally poled in a first poling direction;
a second waveguide transversally poled in a second poling direction, wherein said first and second waveguides are of identical type and are arranged parallel to one other for each carrying at least one optical mode having two orthogonal light polarization directions, and wherein said first and second waveguides are supported on said holder with said first and said second poling directions being anti-parallel;

a coupling between said first and said second waveguides for exchanging said orthogonal light polarization directions of the optical modes in the first and in the second waveguides such that a photon running along one of the first and second waveguides and being polarized along a slow axis of the one waveguide is coupled to a photon being polarized along a fast axis of the other of the first and second waveguides and vice versa;

a control unit for sending light at least once through said first waveguide, said coupling and said second waveguide for measuring a phase delay between:

light waves that travel through said first waveguide with a polarization along the first poling direction and through said second waveguide with a polarization perpendicular to said second poling direction, and light waves that travel through said first waveguide with a polarization perpendicular to said first poling direction and through the second waveguide with a polarization along said second poling direction; and a Faraday rotator with a rotation angle per pass of 45°+k*90°, with k being any integer number, arranged between the control unit and the first waveguide.

2. The voltage measurement device of claim 1, comprising:
a polarization maintaining feed fiber arranged between the control unit and the Faraday rotator, wherein the fast and slow axes of the first waveguide are oriented at 45° with regard to the axes of the polarization maintaining feed fiber.

3. The voltage measurement device according to claim 1, wherein the coupling comprises one of:
a direct orthogonal splicing of the first and second waveguides; and
a polarization maintaining coupling fiber between the first and second waveguides that is spliced to the first waveguide in a first orientation and to the second waveguide in a second orientation, with the first and second orientations being rotated by 90°.

4. The voltage measurement device according to claim 1, comprising:
a phase modulator for nonreciprocal phase modulation.

5. The voltage measurement device of claim 4, wherein the phase modulator is an integrated-optics birefringence modulator for directly modulating a phase of orthogonal light waves.

6. The voltage measurement device of claim 4, comprising:
an entrance polarization-maintaining fiber lead of the phase modulator for coupling polarized light at a 45° splice, wherein the fast and slow axes of the entrance polarization-maintaining fiber lead and the polarization maintaining feed fiber are parallel to electro-optic axes of the phase modulator.

7. The voltage measurement device of claim 4, wherein the phase modulator is an integrated-optics phase modulator for a nonreciprocal phase modulation for functioning as a polarizer, or as a piezoelectric modulator.

8. A voltage measurement device comprising:
a holder for arrangement between two potentials;
a first waveguide transversally poled in a first poling direction;
a second waveguide transversally poled in a second direction, wherein said first and second waveguides are of identical type and are arranged parallel to one other for each carrying at least one optical mode having two orthogonal light polarization directions, and wherein said first and second waveguides are supported on said holder with said first and said second poling directions being anti-parallel;

a coupling between said first and said second waveguides for exchanging said orthogonal light polarization directions of said optical modes;

a control unit for sending light at least once through said first waveguide, said coupling and said second waveguide for measuring a phase delay between:

light waves that travel through said first waveguide with a polarization along the first poling direction and through said second waveguide with a polarization perpendicular to said second poling direction, and light waves that travel through said first waveguide with a polarization perpendicular to said first poling direction and through the second waveguide with a polarization along said second poling direction;

a pair of identical polarization maintaining fibers located after the first and second waveguides, as part of a detection system, joined with a 90° splice; and a phase controller for controlling a length of one of the polarization maintaining fibers to maintain a differential phase of interfering waves at quadrature.

9. The voltage measurement device of claim 8, wherein said holder comprises:
a rod having a longitudinal axis and wherein said first and said second waveguides are wound along a helical path around said axis with said first and said second poling directions not being orthogonal to said longitudinal axis.

10. The voltage measurement device of claim 8, wherein a mutual distance of said first and second waveguides is smaller than a pitch of said helical path.

11. The voltage measurement device of claim 8, wherein said holder has a cylindrical surface around said longitudinal axis, and said first and said second waveguides are wound around said surface.

12. The voltage measurement device of claim 8, wherein said first waveguide comprises:
a core of a first fiber and said second waveguide comprises a core of a second fiber.

13. The voltage measurement device of claim 12, wherein said first and said second fibers are arranged adjacent to each other.

14. The voltage device of any of claim 12, wherein said first and said second fibers are of identical design.

15. The voltage measurement device of claim 12, wherein said first and said second fibers are mounted to opposite sides of a common carrier which is mounted to said holder.

16. The voltage measurement device of claim 15, wherein said first and said second fibers have a D-shape and are mounted on a top and bottom surface of the carrier.

17. The voltage device of claim 15, wherein said first and said second fibers are mounted in recesses on opposite sides of said carrier.

18. The voltage measurement device of claim 15, wherein said carrier is helically wound around said holder.

19. The voltage measurement device of claim 12, wherein said first and said second fibers have elliptical, square or rectangular cross-sections and are wrapped directly to a surface of the holder.

20. The voltage measurement device of claim 8, wherein said first and said second waveguides comprise:
two cores of a common fiber, wherein two frozen-in electric fields with opposite directions are created in core regions during poling.

21. The voltage measurement device of claim 8, wherein said holder is arranged in an insulation housing which carries plural circumferential sheds, and wherein said first and second waveguides are arranged between said holder and said insulation housing.

22. The voltage measurement device of claim 21, wherein said sheds are arranged at an outside of an insulator tube, and wherein said waveguides are arranged between said holder and said insulator tube.

23. The voltage measuring device of claim 8, wherein said first and said second waveguides extend parallel to each other.

24. The high voltage measuring device of claim 8, comprising:
   plural pairs of said first and second waveguides arranged in series.

* * * * *